(12) United States Patent
Kuo et al.

(10) Patent No.: US 10,978,355 B2
(45) Date of Patent: Apr. 13, 2021

(54) MULTI-GATE DEVICES WITH REPLACED-CHANNELS AND METHODS FOR FORMING THE SAME

(71) Applicant: Taiwan Semiconductor Manufacturing Company, Ltd., Hsinchu (TW)

(72) Inventors: Chih-Wei Kuo, Tainan (TW); Yuan-Shun Chao, Zhubei (TW); Hou-Yu Chen, Zhubei (TW); Shyh-Horng Yang, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 18 days.

(21) Appl. No.: 15/985,830

(22) Filed: May 22, 2018

(65) Prior Publication Data

US 2018/0269112 A1 Sep. 20, 2018

Related U.S. Application Data

(60) Continuation of application No. 14/887,102, filed on Oct. 19, 2015, now Pat. No. 10,014,223, which is a
(Continued)

(51) Int. Cl.
*H01L 21/8238* (2006.01)
*H01L 27/092* (2006.01)
(Continued)

(52) U.S. Cl.
CPC ........ *H01L 21/823821* (2013.01); *H01L 21/823431* (2013.01); *H01L 21/823437* (2013.01);
(Continued)

(58) Field of Classification Search
CPC ....... H01L 27/0886; H01L 21/823431; H01L 21/823821; H01L 21/845; H01L 27/0924;
(Continued)

(56) References Cited

U.S. PATENT DOCUMENTS 6,720,619 B1 4/2004 Chen
6,936,516 B1 8/2005 Goo et al.
(Continued)

FOREIGN PATENT DOCUMENTS

CN 1992255 7/2007
CN 101261991 9/2008
(Continued)

*Primary Examiner* — Stephen M Bradley
(74) *Attorney, Agent, or Firm* — Slater Matsil, LLP

(57) ABSTRACT

A device includes a semiconductor substrate, isolation regions in the semiconductor substrate, and a Fin Field-Effect Transistor (FinFET). The FinFET includes a channel region over the semiconductor substrate, a gate dielectric on a top surface and sidewalls of the channel region, a gate electrode over the gate dielectric, a source/drain region, and an additional semiconductor region between the source/drain region and the channel region. The channel region and the additional semiconductor region are formed of different semiconductor materials, and are at substantially level with each other.

20 Claims, 15 Drawing Sheets

Related U.S. Application Data division of application No. 13/457,258, filed on Apr. 26, 2012, now Pat. No. 9,171,925.

(51) Int. Cl.

| | | |
|---|---|---|
| *H01L 29/78* | (2006.01) | |
| *H01L 29/165* | (2006.01) | |
| *H01L 29/66* | (2006.01) | |
| *H01L 29/10* | (2006.01) | |
| *H01L 21/8234* | (2006.01) | |
| *H01L 21/306* | (2006.01) | |
| *H01L 21/3105* | (2006.01) | |

(52) U.S. Cl.
CPC .. *H01L 21/823481* (2013.01); *H01L 27/0924* (2013.01); *H01L 29/1054* (2013.01); *H01L 29/165* (2013.01); *H01L 29/66545* (2013.01); *H01L 29/66795* (2013.01); *H01L 29/785* (2013.01); *H01L 29/7848* (2013.01); *H01L 29/7849* (2013.01); *H01L 21/30604* (2013.01); *H01L 21/31055* (2013.01); *H01L 29/6656* (2013.01)

(58) Field of Classification Search
CPC .......... H01L 27/1211; H01L 29/66795; H01L 29/785; H01L 29/0657; H01L 29/7851; H01L 29/7842; H01L 29/7848; H01L 21/823814; H01L 21/823418; H01L 29/66545; H01L 29/66606; H01L 29/66871; H01L 29/16; H01L 29/1608; H01L 29/165; H01L 29/205; H01L 29/1054
See application file for complete search history.

(56) References Cited

U.S. PATENT DOCUMENTS

| | | | |
|---|---|---|---|
| 7,172,943 B2 | 2/2007 | Yeo et al. | |
| 7,211,864 B2 | 5/2007 | Seliskar | |
| 7,544,994 B2 | 6/2009 | Schepis et al. | |
| 7,612,405 B2 | 11/2009 | Yu | |
| 7,622,773 B2 | 11/2009 | Irisawa | |
| 7,651,893 B2 | 1/2010 | Chen | |
| 7,714,384 B2 | 5/2010 | Seliskar | |
| 7,728,324 B2 | 6/2010 | Tezuka | |
| 7,812,370 B2 | 10/2010 | Bhuwalka et al. | |
| 7,863,674 B2 | 1/2011 | Yeo | |
| 7,879,675 B2 | 2/2011 | Radosavljevic et al. | |
| 7,915,112 B2 | 3/2011 | Xu et al. | |
| 7,972,914 B2 | 7/2011 | Kim et al. | |
| 8,053,299 B2 | 11/2011 | Xu | |
| 8,466,034 B2 | 6/2013 | Maszara et al. | |
| 8,466,511 B2 | 6/2013 | Oh | |
| RE44,431 E | 8/2013 | Pendse | |
| 8,735,232 B2 | 5/2014 | Baars et al. | |
| 2002/0003256 A1 | 1/2002 | Maegawa | |
| 2002/0037619 A1 | 3/2002 | Sugihara et al. | |
| 2002/0072197 A1 | 6/2002 | Kang et al. | |
| 2005/0056888 A1 | 3/2005 | Youn | |
| 2005/0145932 A1 | 6/2005 | Park | |
| 2005/0156171 A1 | 7/2005 | Brask et al. | |
| 2005/0224800 A1* | 10/2005 | Lindert | H01L 29/1054 257/66 |
| 2005/0263795 A1 | 12/2005 | Choi | |
| 2006/0172497 A1 | 8/2006 | Hareland et al. | |
| 2007/0020879 A1 | 1/2007 | Baek et al. | |
| 2007/0045736 A1 | 3/2007 | Yagishita | |
| 2007/0063263 A1 | 3/2007 | Oh et al. | |
| 2007/0102763 A1 | 5/2007 | Yeo et al. | |
| 2007/0134884 A1 | 6/2007 | Kim et al. | |
| 2007/0210355 A1 | 9/2007 | Izumida | |
| 2007/0235819 A1 | 10/2007 | Yagishita | |
| 2007/0267680 A1* | 11/2007 | Uchino | H01L 27/0207 257/315 |
| 2008/0079094 A1* | 4/2008 | Jin | H01L 29/66628 257/401 |
| 2008/0157172 A1 | 7/2008 | Lee | |
| 2008/0299734 A1 | 12/2008 | Lee et al. | |
| 2009/0072276 A1* | 3/2009 | Inaba | H01L 21/823807 257/255 |
| 2009/0095980 A1 | 4/2009 | Yu et al. | |
| 2009/0095989 A1 | 4/2009 | Kim | |
| 2009/0230483 A1 | 9/2009 | Mizumura | |
| 2009/0267155 A1 | 10/2009 | Izumida et al. | |
| 2009/0315112 A1 | 12/2009 | Lee | |
| 2010/0044784 A1 | 2/2010 | Oh | |
| 2010/0052059 A1 | 3/2010 | Lee | |
| 2010/0133614 A1 | 6/2010 | Beyer et al. | |
| 2010/0163970 A1 | 7/2010 | Rakshit | |
| 2010/0207208 A1 | 8/2010 | Bedell et al. | |
| 2010/0301391 A1 | 12/2010 | Lochtefeld | |
| 2011/0031552 A1 | 2/2011 | Iwamatsu et al. | |
| 2011/0049613 A1* | 3/2011 | Yeh | H01L 29/66795 257/327 |
| 2011/0073952 A1 | 3/2011 | Kwok et al. | |
| 2011/0095378 A1 | 4/2011 | Lee et al. | |
| 2011/0108930 A1 | 5/2011 | Cheng et al. | |
| 2011/0147811 A1 | 6/2011 | Kavalieros | |
| 2011/0147828 A1 | 6/2011 | Murthy et al. | |
| 2011/0147842 A1 | 6/2011 | Cappellani et al. | |
| 2011/0171795 A1 | 7/2011 | Tsai et al. | |
| 2011/0193141 A1* | 8/2011 | Lin | H01L 29/045 257/255 |
| 2011/0193178 A1 | 8/2011 | Chang | |
| 2011/0210404 A1 | 9/2011 | Su et al. | |
| 2011/0215375 A1 | 9/2011 | Cook, Jr. | |
| 2011/0223736 A1 | 9/2011 | Lin et al. | |
| 2011/0237046 A1 | 9/2011 | Maszara et al. | |
| 2011/0291196 A1 | 12/2011 | Wei | |
| 2011/0316080 A1 | 12/2011 | Luo et al. | |
| 2012/0001266 A1 | 1/2012 | Lim et al. | |
| 2012/0074464 A1 | 3/2012 | Cea | |
| 2012/0091528 A1 | 4/2012 | Chang et al. | |
| 2012/0091538 A1 | 4/2012 | Lin et al. | |
| 2012/0104472 A1 | 5/2012 | Xu et al. | |
| 2012/0135576 A1* | 5/2012 | Lee | H01L 29/1054 438/299 |
| 2012/0139007 A1* | 6/2012 | Tatsumura | H01L 29/045 257/192 |
| 2012/0161238 A1* | 6/2012 | Scheiper | H01L 21/823412 257/368 |
| 2012/0168817 A1 | 7/2012 | Abou-Khalil et al. | |
| 2012/0211807 A1 | 8/2012 | Yu et al. | |
| 2012/0261726 A1 | 10/2012 | Yang et al. | |
| 2012/0299100 A1 | 11/2012 | Ota et al. | |
| 2012/0319211 A1 | 12/2012 | van Dal et al. | |
| 2013/0001591 A1* | 1/2013 | Wu | H01L 21/823821 257/77 |
| 2013/0049140 A1* | 2/2013 | Asenov | H01L 29/517 257/411 |
| 2013/0099282 A1 | 4/2013 | Chen et al. | |
| 2013/0134506 A1 | 5/2013 | Yagishita | |
| 2013/0175584 A1 | 7/2013 | Ho et al. | |
| 2013/0181264 A1 | 7/2013 | Liao et al. | |
| 2013/0187206 A1 | 7/2013 | Mor et al. | |
| 2013/0200455 A1 | 8/2013 | Lo et al. | |
| 2013/0200459 A1 | 8/2013 | Adam et al. | |
| 2013/0200468 A1 | 8/2013 | Cai et al. | |
| 2013/0248948 A1* | 9/2013 | Ma | H01L 29/66636 257/288 |
| 2013/0270628 A1 | 10/2013 | Huang et al. | |
| 2013/0285141 A1 | 10/2013 | Kuo et al. | |

FOREIGN PATENT DOCUMENTS

| | | |
|---|---|---|
| CN | 101677085 | 3/2010 |
| KR | 20060130704 | 12/2006 |
| KR | 1020110098594 | 9/2011 |

\* cited by examiner

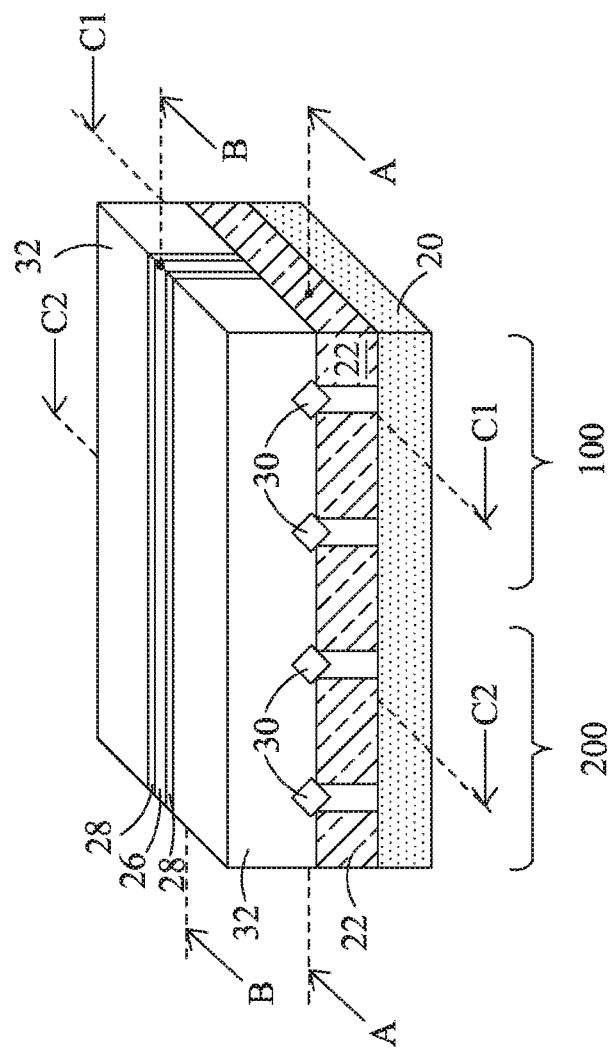
Fig. 7A
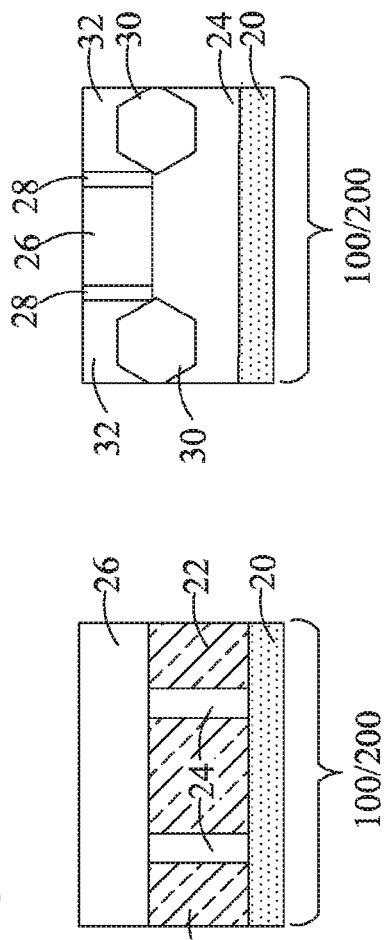
Fig. 7C
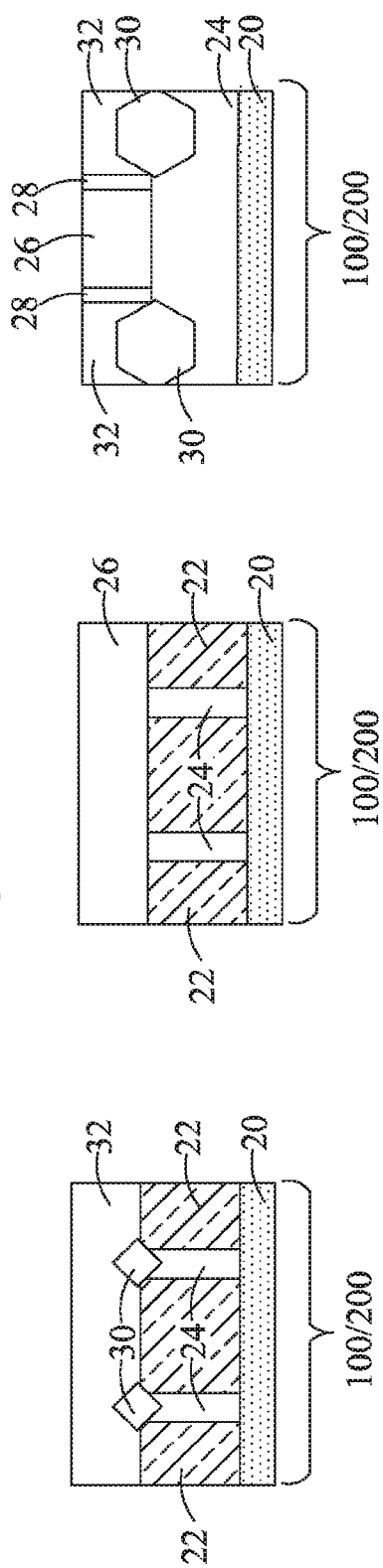
Fig. 7B
Fig. 7D

MULTI-GATE DEVICES WITH REPLACED-CHANNELS AND METHODS FOR FORMING THE SAME

This application is a continuation application of patent application Ser. No. 14/887,102, now U.S. Pat. No. 10,014,223, entitled "Multi-Gate Devices with Replaced-Channels and Methods for Forming the Same," filed on Oct. 19, 2015, which is a divisional application of patent application Ser. No. 13/457,258, entitled "Multi-Gate Devices with Replaced-Channels and Methods for Forming the Same," filed on Apr. 26, 2012, now U.S. Pat. No. 9,171,925, each application is incorporated herein by reference

CROSS-REFERENCE TO RELATED APPLICATION

This application relates to the following commonly-assigned co-pending U.S. patent application: application Ser. No. 13/356,769, filed Jan. 24, 2012, and entitled "FinFETs and Methods for Forming the Same;" which application is hereby incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFETs) were thus developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased.

In an existing FinFET formation process, Shallow Trench Isolation (STI) regions are first formed in a silicon substrate. The STI regions are then recessed to form silicon fins, which comprise portions of the silicon substrate that are over the recessed STI regions. Next, a gate dielectric and a gate electrode are formed. A source and a drain region are then formed, for example, by recessing the silicon fin, and then performing an epitaxy. The epitaxy source and drain regions may have a lattice constant different from that of the respective silicon fin, and hence may provide a beneficial strain to the respective channel region of the FinFET. However, during the subsequent thermal processes, the strain may be relaxed. Furthermore, the impurities in the epitaxy source and drain regions may be adversely diffused into the channel in the subsequent thermal processes.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 13 are perspective views and cross-sectional views of intermediate stages in the manufacturing of Fin Field-Effect Transistors (FinFETs) in accordance with various exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Fin Field-Effect Transistors (FinFETs) and the methods of forming the same are provided in accordance with various embodiments. The intermediate stages of forming the FinFETs are illustrated. The variations of the embodiments are discussed. Throughout the various views and illustrative embodiments, like reference numbers are used to designate like elements.

Figure 1:
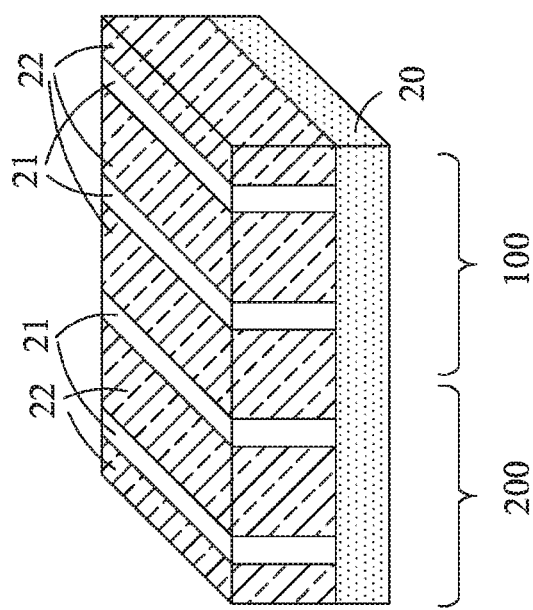

FIGS. 1 through 13 are cross-sectional views and perspective views of intermediate stages in the manufacturing of Fin Field-Effect Transistors (FinFETs) in accordance with some exemplary embodiments. FIG. 1 illustrates a perspective view of an initial structure. The initial structure includes substrate 20. Substrate 20 may be semiconductor substrate, which may further be a silicon substrate, a silicon germanium substrate, or a substrate formed of other semiconductor materials. Substrate 20 may be doped with a p-type or an n-type impurity. Isolation regions such as Shallow Trench Isolation (STI) regions 22 may be formed to extend from a top surface of substrate 20 into substrate 20. Substrate 20 includes a first portion in device region 100 and a second portion in device region 200. In some embodiments, one of the device regions 100 and 200 is a p-type FinFET region, and the other device region is an n-type FinFET region. The portions of substrate 20 between neighboring STI regions 22 form semiconductor strips 21. The top surfaces of semiconductor strips 21 and the top surfaces of STI regions 22 may be substantially level with each other.

Figure 2:
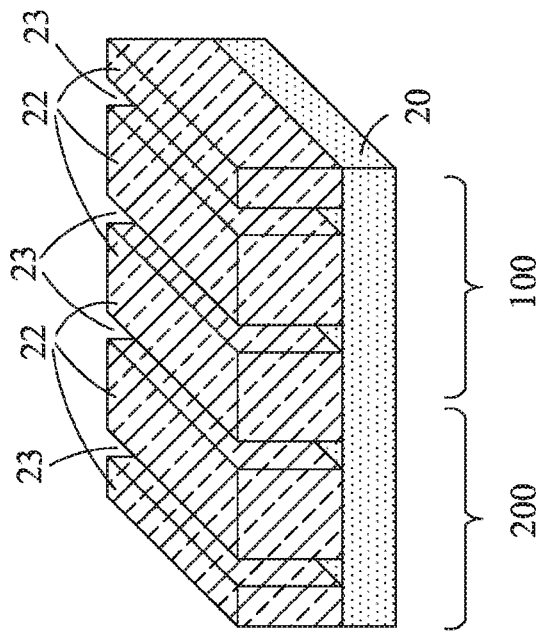
Figure 3:
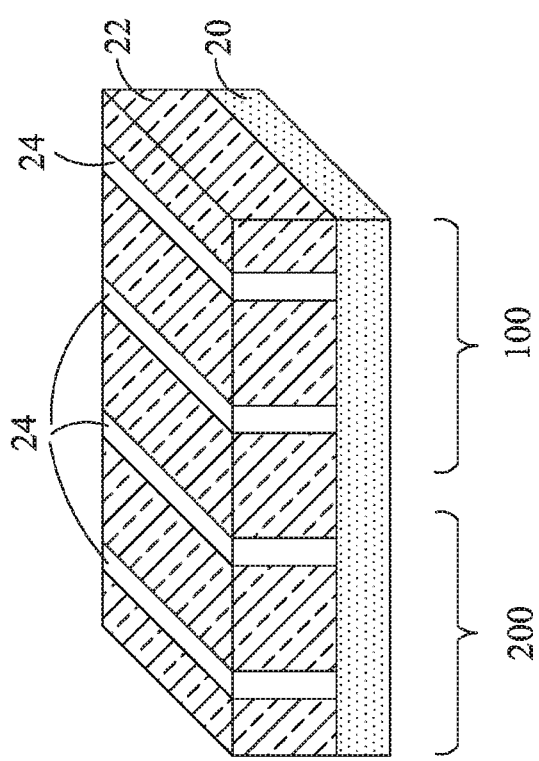

Referring to FIG. 2, at least upper portions, or substantially entireties, of semiconductor strips 21 are removed. Accordingly, recesses 23 are formed in STI regions 22. Next, as shown in FIG. 3, an epitaxy is performed to epitaxially grow semiconductor strips 24 in recesses 23. Semiconductor strips 24 may have a lattice constant greater than, substantially equal to, or smaller than, the lattice constant of substrate 20. In some embodiments, Semiconductor strips 24 comprise silicon germanium, silicon carbon, a III-V compound semiconductor, or the like. The top surface of the resulting semiconductor strips 24 may be higher than, level with, or lower than the top surface of STI regions 22.

In some embodiments, the process steps in FIGS. 2 and 3 are omitted, and semiconductor strips 21 remain. Accordingly, semiconductor strips 24 that are illustrated in subsequent drawings are actually semiconductor strips 21, which may be formed of a same semiconductor material as substrate 20.

Figure 4:
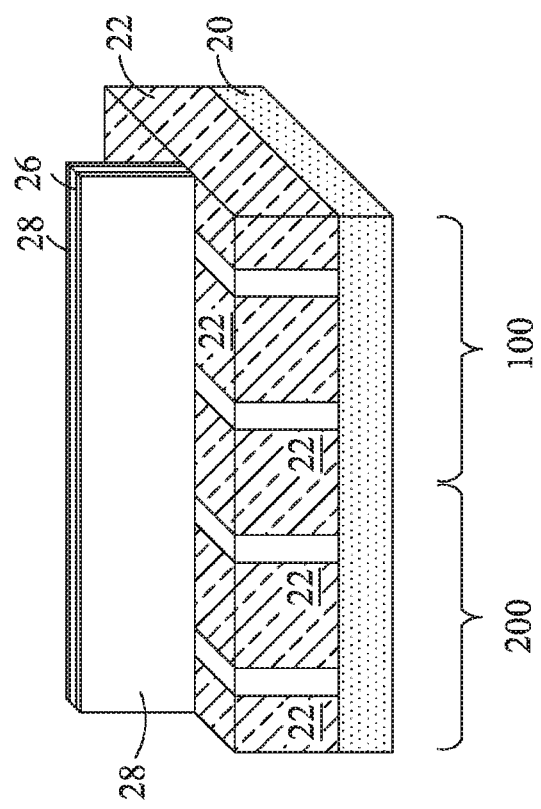

Referring to FIG. 4, dummy gate 26 is formed. Dummy gate 26 may be formed of, for example, polysilicon, although other materials that have a high etching selectivity from STI regions 22 may also be used. Dummy gate 26 is over portions of semiconductor strips 24, and may cross-over a plurality of semiconductor strips 24 and/or STI regions 22. Dummy gate 26 may also have a lengthwise direction substantially perpendicular to the lengthwise direction of semiconductor strips 24. Dummy gate 26 may include a portion in device region 100 and a portion in device region 200.

Next, as also shown in FIG. 4, gate spacers 28 are formed on the sidewalls of dummy gate 26. In some embodiments, gate spacers 28 comprise silicon oxide, silicon nitride, and the like, and may have a multi-layer structure.

Figure 6:
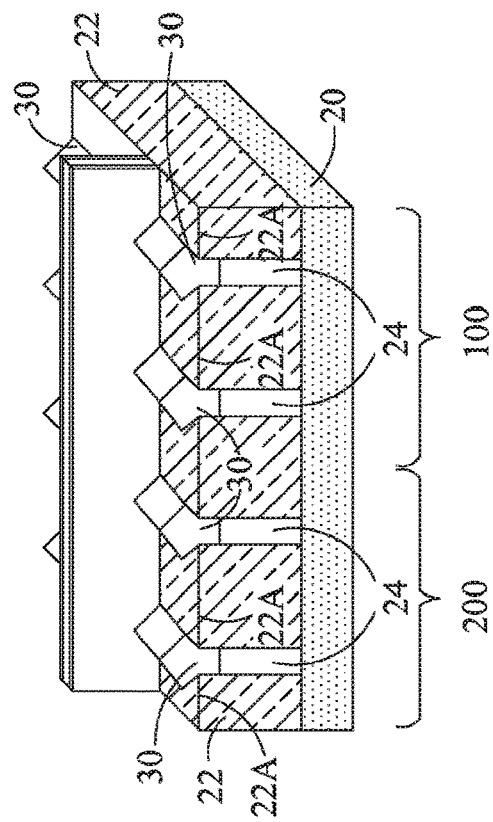
Figure 5:
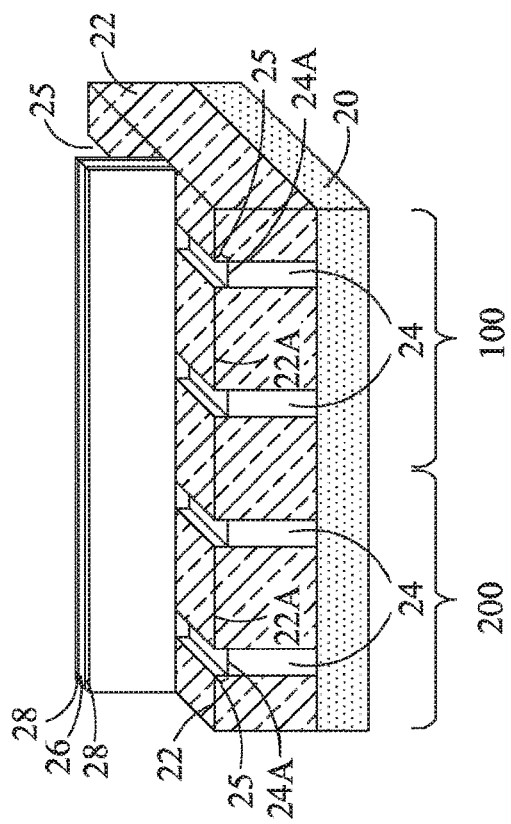

Referring to FIG. 5, an etching step is performed to etch portions of semiconductor strips 24 that are not covered by dummy gate 26 and gate spacers 28. The resulting top surfaces 24A of the recessed semiconductor strips 24 is thus lower than the top surfaces 22A of STI regions 22. Recesses 25 are accordingly formed between STI regions 22. Recesses 25 are located on opposite sides of dummy gate 26. Next, as shown in FIG. 6, epitaxy regions 30 are formed by selectively growing a semiconductor material in recesses 25. In some exemplary embodiments, epitaxy regions 30 comprise silicon germanium or silicon carbon. Alternatively, epitaxy regions 30 are formed of silicon, III-V semiconductor materials, or the like. After recesses 25 are filled with epitaxy regions 30, the further epitaxial growth of epitaxy regions 30 causes epitaxy regions 30 to expand horizontally, and facets start to form. Furthermore, some of top surfaces 22A of STI regions 22 are underlying and aligned to portions of epitaxy regions 30 due to the lateral growth of epitaxy regions 30. Alternatively, no recess of semiconductor strips 24 is performed, and epitaxy regions 30 are formed on the un-recessed semiconductor strips 24.

After the epitaxy step, epitaxy regions 30 may be implanted to form source and drain regions, which are also denoted using reference numeral 30. Source and drain regions 30 are on opposite sides of dummy gate 26, and may be overlying and overlapping portions of surfaces 22A of STI regions 22. When device regions 100 and 200 include an n-type FinFET region and a p-type FinFET region, the source/drain regions 30 in device regions 100 and 200 have opposite conductivity types. Following the formation of source and drain regions 30, source and drain silicide regions (not shown) may be formed by siliciding the top portions of source and drain regions 30. Alternatively, the source and drain silicide regions may be formed in the step shown in FIG. 13.

FIG. 7A illustrates a perspective view of the structure after Inter-Layer Dielectric (ILD) 32 is formed. A Chemical Mechanical Polish (CMP) may be performed to level the top surfaces of ILD 32, dummy gate 26, and gate spacers 28. FIG. 7B illustrates a cross-sectional view obtained from the plane crossing line A-A in FIG. 7A. FIG. 7C illustrates a cross-sectional view obtained from the plane crossing line B-B in FIG. 7A. FIG. 7D illustrates a cross-sectional view obtained from the plane crossing line C1-C1 or C2-C2 in FIG. 7A. The exemplary locations of regions 22, 24, 30, and 32 are also illustrated in the cross-sectional views.

FIGS. 8A through 12G illustrate the perspective views and the respective cross-sectional views in the further manufacturing steps of the FinFETs. Throughout FIGS. 8A through 12G, each of the Figures is marked with a number followed by a letter. The Figures with the same number are different views of a same process step and a same structure. In each of the cross-sectional views, the respective device region and the plane, from which the respective cross-sectional view is retrieved, are marked. For example, in FIG. 8B, "100—A-A View" is marked, indicating that the cross-sectional view is obtained from device region 100, and from the plane crossing line A-A in FIG. 8A.

Figure 8A:
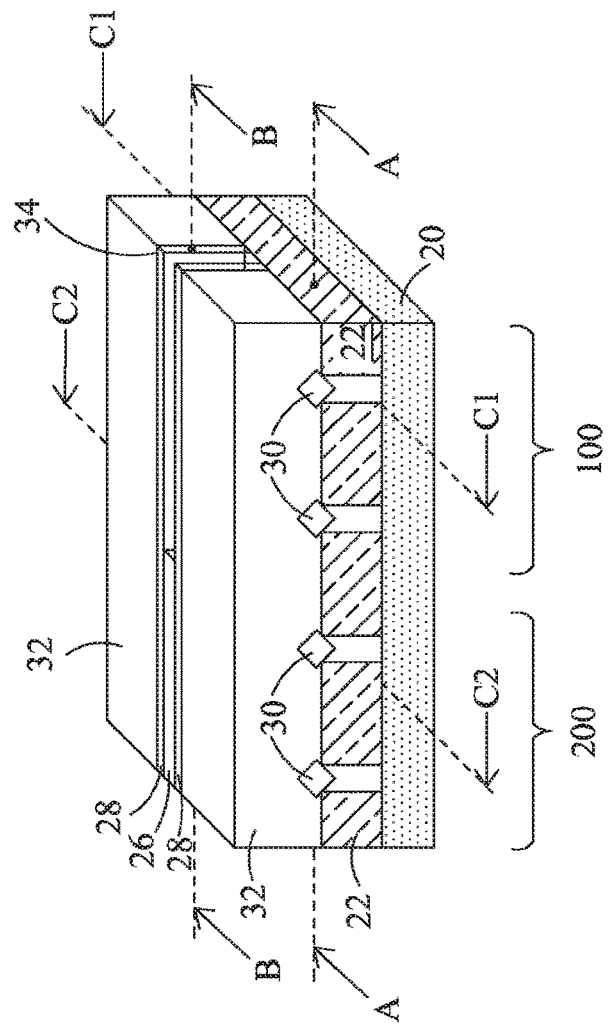
Figure 8D:
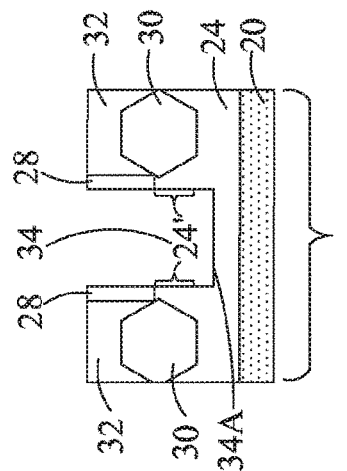
Figure 8C:
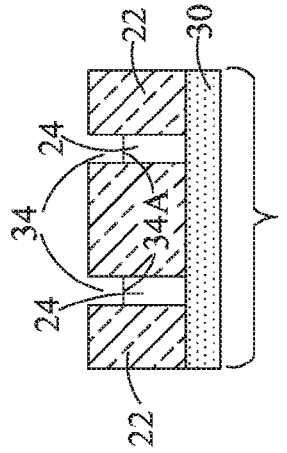
Figure 8B:
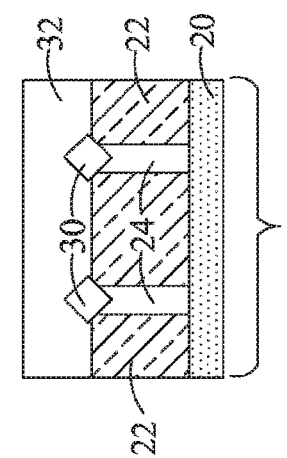

Referring to FIG. 8A, the portion of dummy gate 26 in device region 100 is removed, for example, through etching. The portion of dummy gate 26 in device region 200, however, remains not removed. FIGS. 8B through 8G are different views of the structure shown in FIG. 8A, wherein the removal of dummy gate 26 is illustrated in FIGS. 8C and 8D, and may be observed by comparing to FIGS. 7C and 7D, respectively. As shown in FIG. 8D, the removed portion of dummy gate 26 is at substantially a same level as gate spacers 28.

Figure 8G:
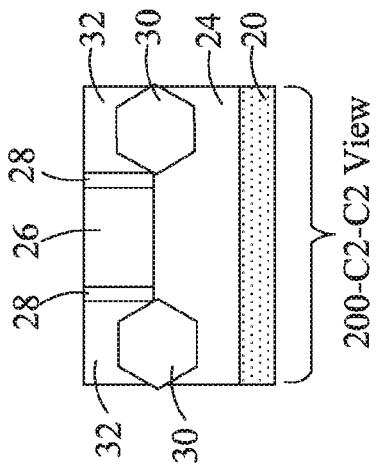
Figure 8F:
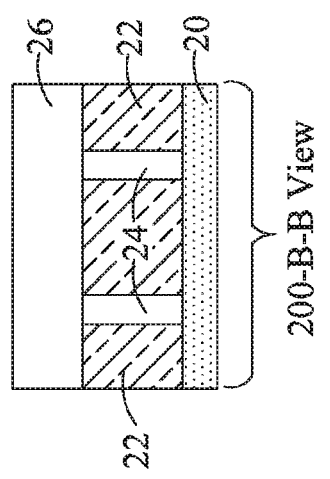
Figure 8E:
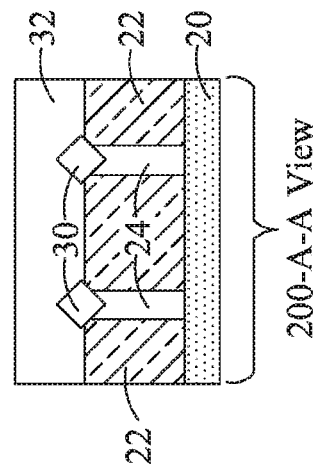

Referring to FIG. 8A, the removal of dummy gate 26 may be performed by forming a photo resist (not shown) to protect device region 200, and then etching dummy gate 26. Next, as shown in FIGS. 8C and 8D, the exposed semiconductor strips 24 are recessed, forming recesses 34 in STI regions 22. The recessing may comprise an anisotropic etching using gate spacers 28 as an etching mask, so that the sidewalls of recesses 34 are substantially vertical, and are substantially aligned to the edges of gate spacers 28. Bottoms 34A of recesses 34 may be higher than the bottom surfaces of semiconductor strips 24, and may be substantially level with, or slightly higher than, the bottoms of source/drain regions 30 (FIG. 8D). In some embodiments, as shown in FIG. 8D, semiconductor strips 24 may have portions 24' left unetched, with portions 24' having side edges exposed to recess 34. In FIGS. 8E, 8F, and 8G, which are the views of device region 200, however, dummy gate 26 and semiconductor strips 24 are not recessed.

Figure 9A:
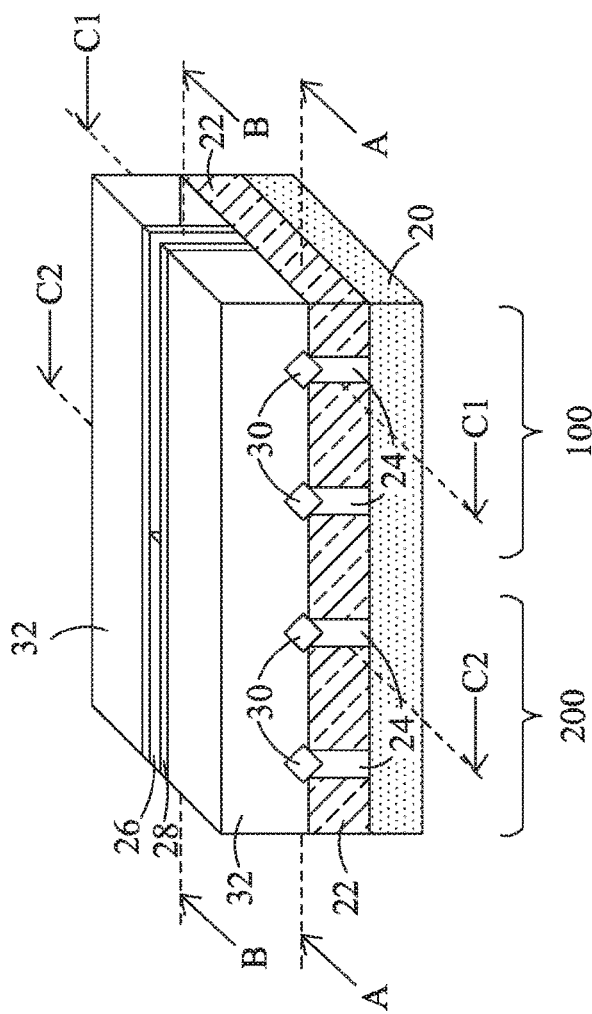
Figure 9D:
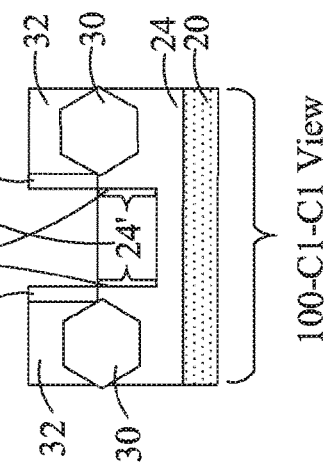
Figure 9C:
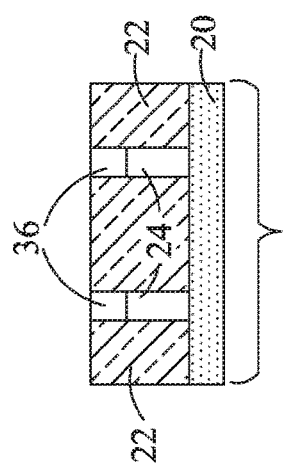
Figure 9B:
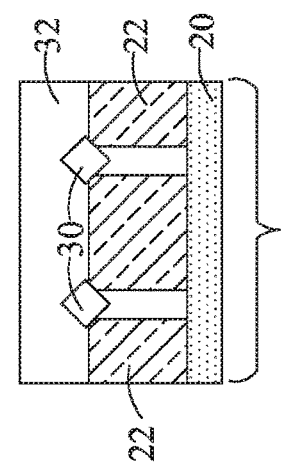
Figure 9G:
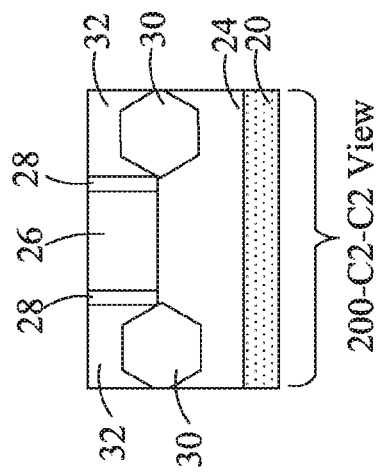
Figure 9F:
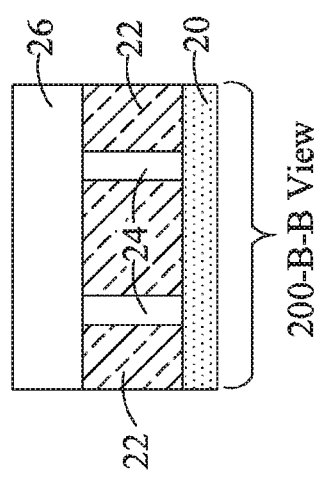
Figure 9E:
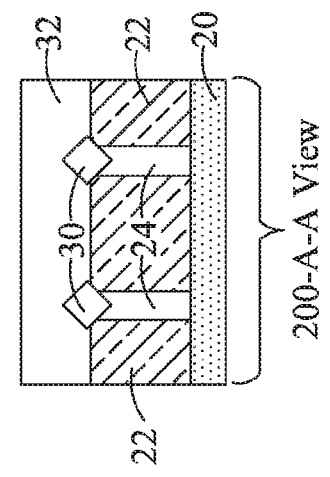

FIGS. 9A through 9D illustrate a perspective view and cross-sectional views in the formation of epitaxy semiconductor regions 36 (FIGS. 9C and 9D), which is formed by selective epitaxial growth. Epitaxy semiconductor regions 36 are grown from semiconductor strips 24, and are not grown on STI regions 22. As shown in FIG. 9D, epitaxy semiconductor regions 36 may have edges 36A (which are also the edges of portions 24') substantially aligned to the edges of gate spacers 28. It is appreciated that since epitaxy regions 36 and semiconductor strips 24 are formed in different process steps, there are visible and distinguishable interfaces (also shown as 36A) between epitaxy regions 36 and semiconductor strips 24. FIGS. 9E, 9F, and 9D illustrate the same process step. It is observed that when epitaxy semiconductor regions 36 are grown in device region 100, epitaxy semiconductor regions 36 are not grown in device region 200.

In some embodiments, epitaxy semiconductor regions 36 have a lattice constant greater than, substantially equal to, or smaller than, the lattice constant of semiconductor strips 24. For example, epitaxy semiconductor regions 36 may comprise silicon germanium, silicon carbon, III-V compound semiconductors, or the like. Furthermore, epitaxy semiconductor regions 36 and semiconductor strips 24 may include same elements that have different percentages. In some exemplary embodiments, epitaxy semiconductor regions 36 and semiconductor substrate 24 both comprise silicon germanium, and have different germanium percentages. The desirable material of epitaxy regions 36 are selected according to the desirable stress in the channel region of the FinFET in device region 100.

Figure 10A:
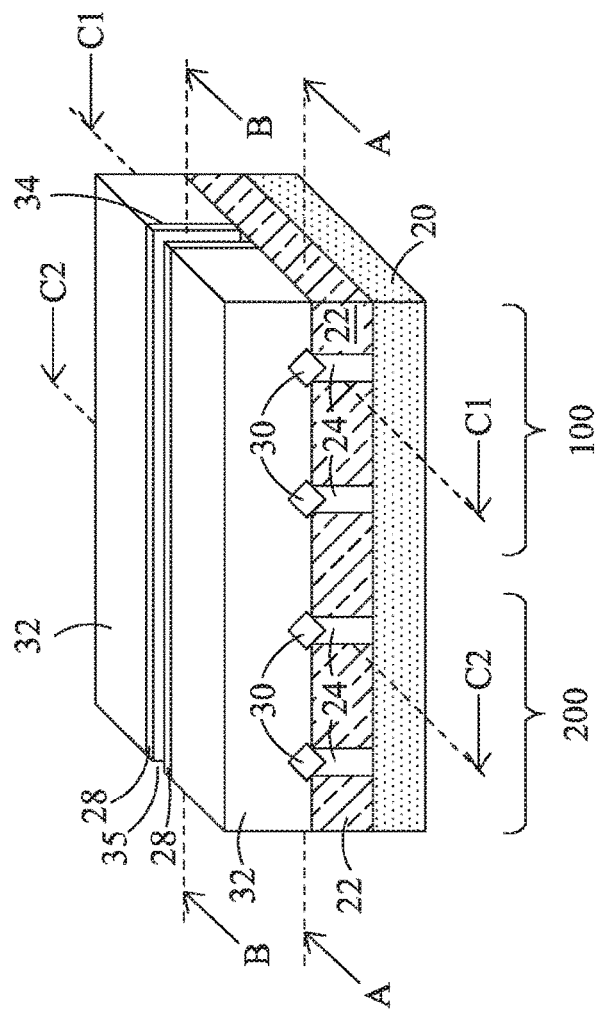
Figure 10D:
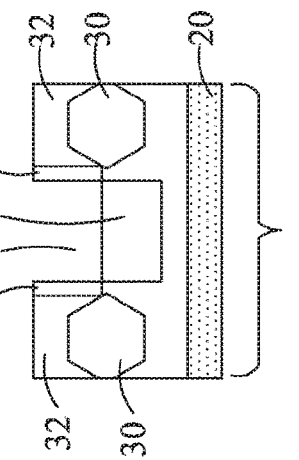
Figure 10C:
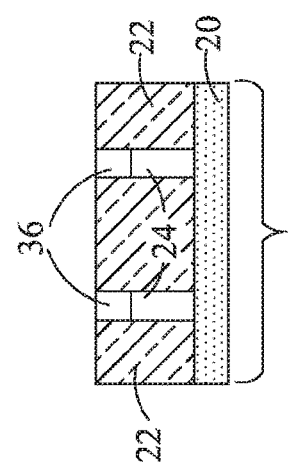
Figure 10B:
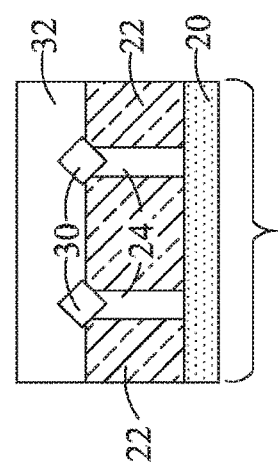
Figure 10G:
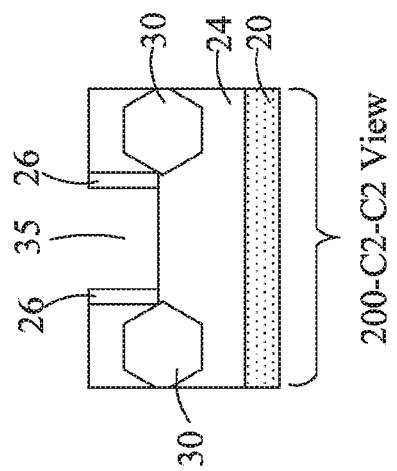
Figure 10F:
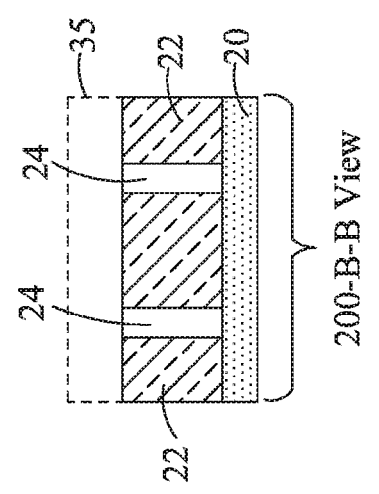
Figure 10E:
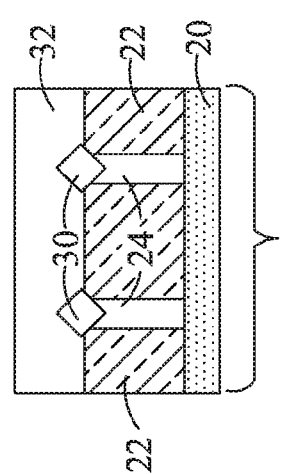

FIG. 10A and FIGS. 10B through 10G illustrate a perspective view and cross-sectional views in the removal of dummy gate 26 from device region 200. As shown in FIGS. 10F and 10G, dummy gate 26 is removed to form recess 35 in device region 200 and between gate spacers 28, and the underlying semiconductor strips 24 are exposed. The cross-sectional view shown in FIGS. 10B, 10C, and 10D remain the same as in FIGS. 9B, 9C, and 9D, respectively.

Figure 11A:
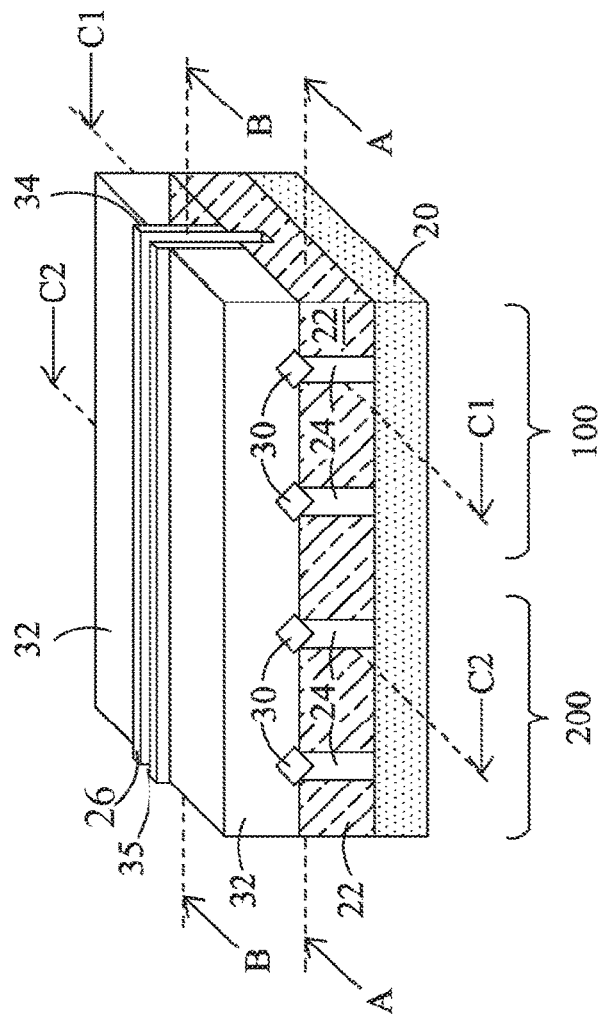
Figure 11D:
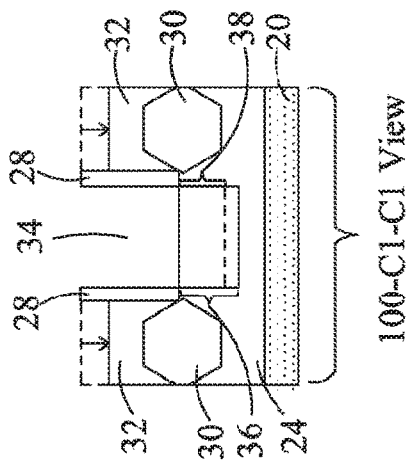
Figure 11B:
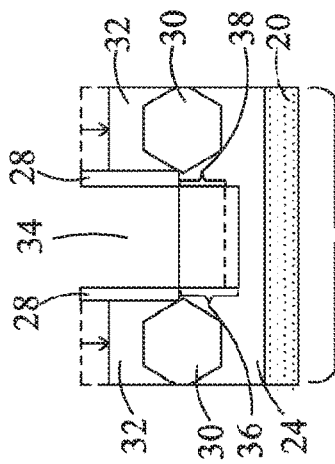
Figure 11C:
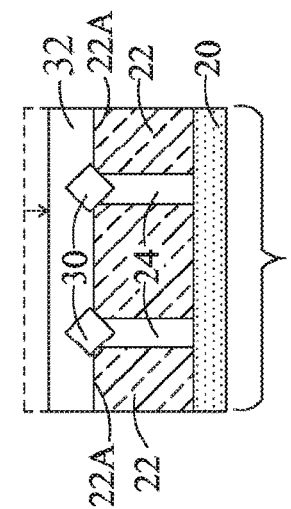
Figure 11G:
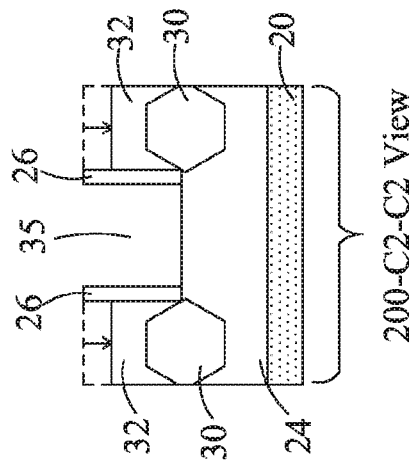
Figure 11F:
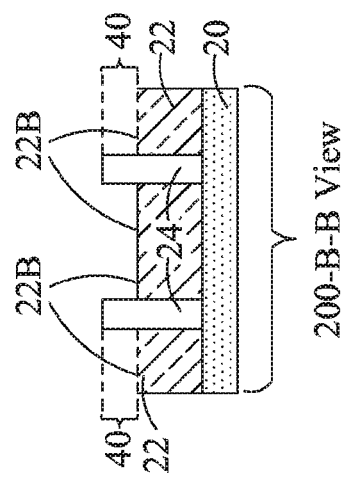
Figure 11E:
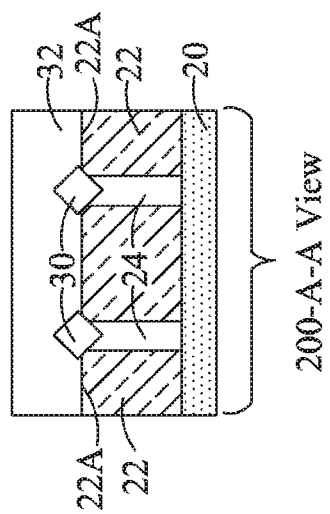

Next, referring to FIGS. 11A through 11G, in both device regions 100 and 200, an etching is performed to etch the portions of STI regions 22 underlying the removed dummy gate 26, so that epitaxy regions 36 (FIG. 11C) in device region 100 and semiconductor strips 24 (FIG. 11F) in device region 200 protrude over the respective adjoining STI regions 22. Throughout the description, the protruding portions of epitaxy regions 36 are referred to as semiconductor fins 38, and the protruding portions of semiconductor strips 24 are referred to as semiconductor fins 40. As a result of the etching, as shown in FIGS. 11B and 11E, some portions of STI regions 22 are not etched, and have top surfaces 22A, while portions of STI regions 22 that were previously underlying dummy gate 26 are recessed to have top surfaces 22B (FIGS. 11C and 11F). Top surfaces 22B are lower than top surfaces 22A by the height of semiconductor fins 38 and 40. Furthermore, top surfaces 22A may be substantially level with the top surfaces of semiconductor fins 38 and 40.

As shown in FIGS. 11D and 11G, at the time STI regions 22 are recessed, ILD 32 may also be recessed as a side effect. The recess of ILD 32 is shown by arrows. As a result of the etching of ILD 32, the top surface of ILD 32 may be lower than the top surface of gate spacers 28.

FIGS. 12A through 12G illustrate the formation of gate dielectrics 42 (including 142 and 242) and gate electrodes 44 (including 144 and 244). To form gate dielectrics 42 and gate electrodes 44, first, a gate dielectric layer is formed in recess 34 and 35 (FIG. 11A) and on the top surfaces and the sidewalls of semiconductor fins 38 and 40 (FIGS. 12C, 12D, 12F, and 12G). In accordance with some embodiments, the gate dielectric layer comprises silicon oxide, silicon nitride, or multilayers thereof. In alternative embodiments, the gate dielectric layer comprises a high-k dielectric material, and hence are high-k gate dielectrics. The high-k gate dielectric layer may have a k value greater than about 7.0, and may include a metal oxide or a silicate of Hf, Al, Zr, La, Mg, Ba, Ti, Pb, and combinations thereof. The formation methods of the gate dielectric layer may include Molecular-Beam Deposition (MBD), Atomic Layer Deposition (ALD), Physical Vapor Deposition (PVD), and the like.

Next, a conductive material, which is used to form gate electrodes 44, is formed over the gate dielectric layer, and fills the remaining recesses 34 and 35 (FIG. 11A). After the filling of the conductive material, a CMP may be performed to remove the excess portions of the gate dielectric layer and the conductive material over the top surface of ILD 32. In the CMP, portions of gate spacers 28 are also polished, as illustrated by the arrow in FIG. 12D, and the top surfaces of gate spacers 28, ILD 32, gate dielectrics 42, and gate electrodes 44 are level with each other. Gate electrodes 44 may comprise a metal-containing material such as TiN, TaN, TaC, Co, Ru, Al, combinations thereof, and multi-layers thereof.

Figure 12A:
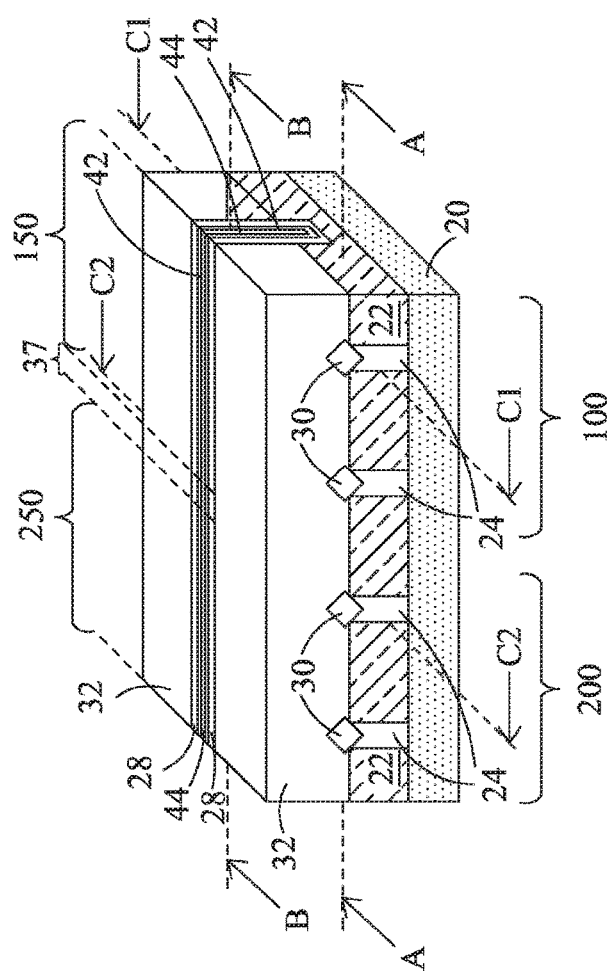
Figure 12B:
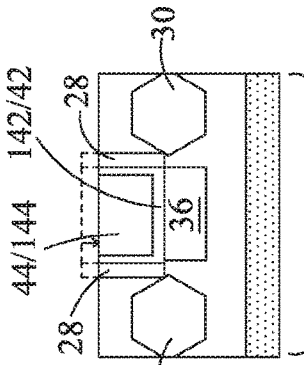
Figure 12C:
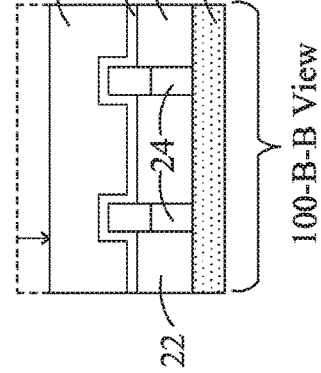
Figure 12D:
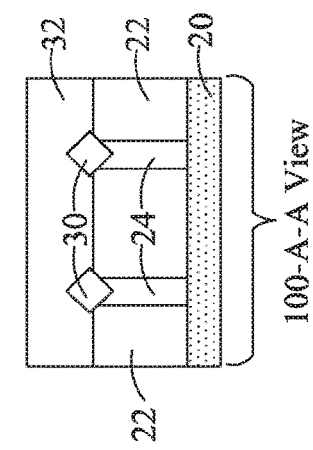
Figure 12G:
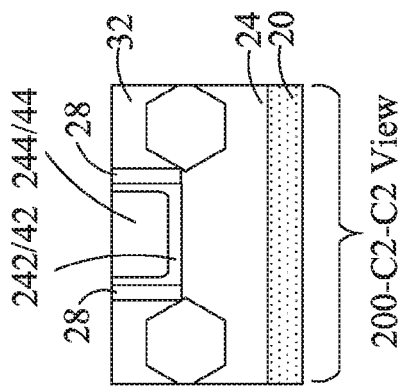
Figure 12F:
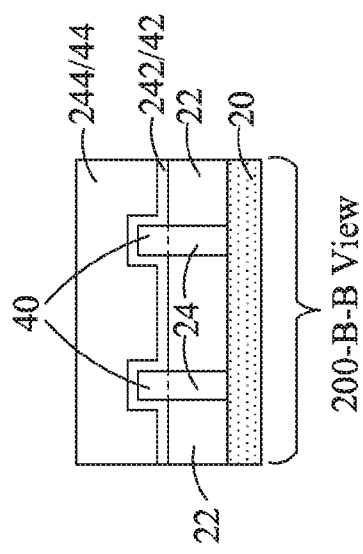
Figure 12E:
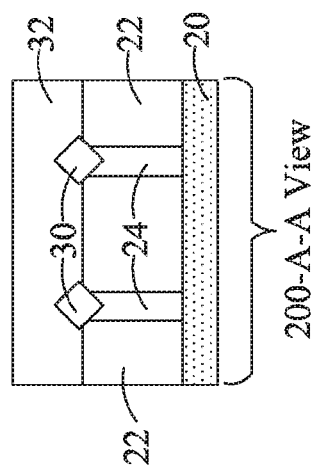

A patterning step may further be performed to remove the portions of the gate dielectric layer and the conductive material in region 37 (FIG. 12A). As a result, gate dielectrics 142 and 242 are separated from each other, and gate electrodes 144 and 244 are separated from each other. Accordingly, FinFETs 150 and 250 are formed in device regions 100 and 200, respectively. FinFET 150 includes gate dielectric 142 and gate electrode 144 (FIGS. 12C and 12D). FinFET 250 includes gate dielectric 242 and gate electrode 244 (FIGS. 12F and 12G). Gate electrodes 144 and 244 are referred to replacement gates hereinafter since they are formed by replacing dummy gate 26. Due to the replacement gate formation, gate dielectrics 142 and 242 have top edges level with the top surfaces of gate electrodes 144 and 244.

Figure 13:
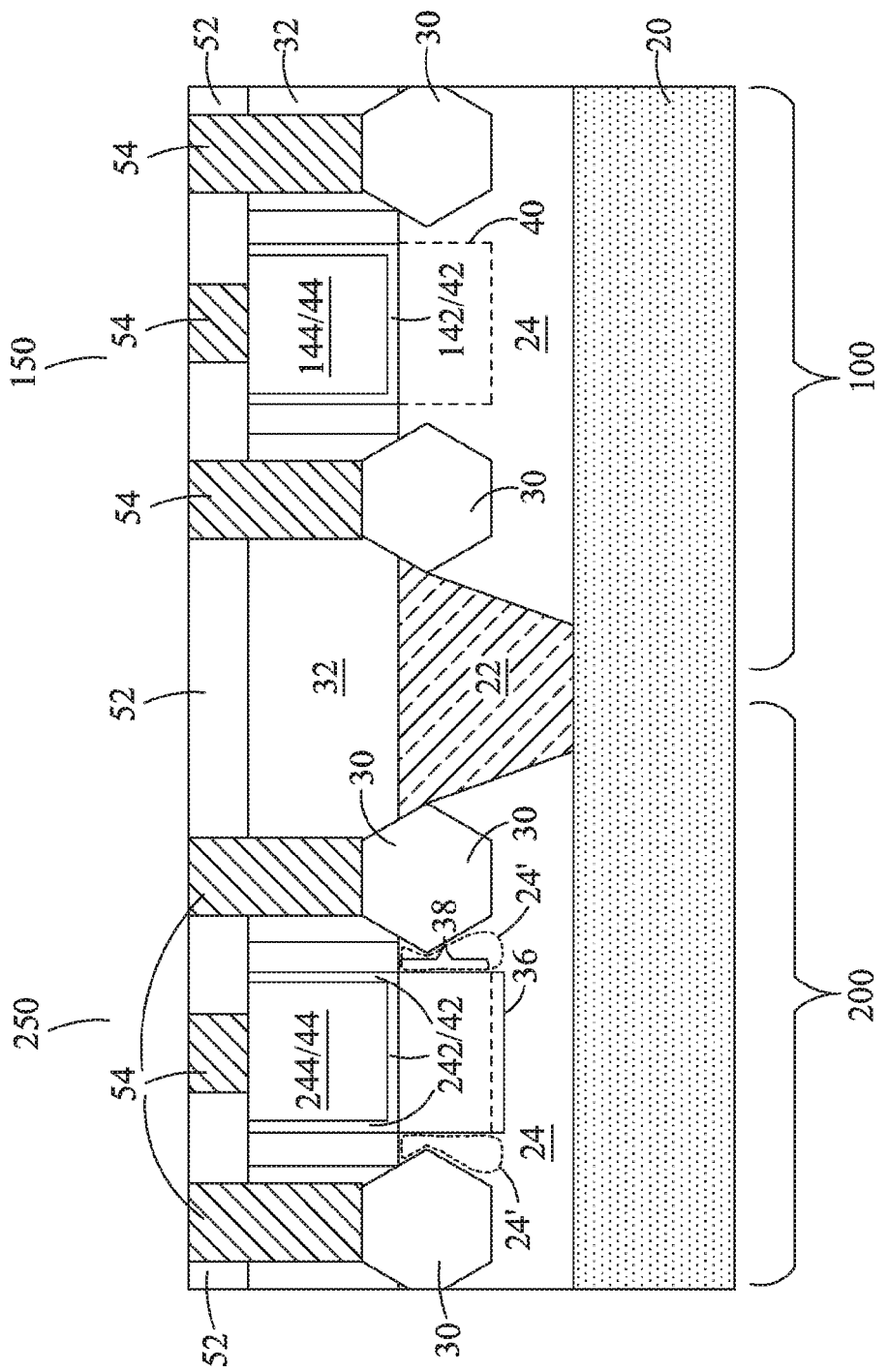

FIG. 13 schematically illustrates cross-sectional views of FinFETs 150 and 250. It is appreciated that the cross-sectional views of FinFETs 150 and 250 are shown as being in a same plane in FIG. 13, although they are actually in different planes crossing lines C1-C1 and C2-C2, respectively, in FIG. 12A. In subsequent process steps, an additional ILD 52 is formed over ILD 32, and contact plugs 54 may be formed to penetrate through ILDs 32 and 52 to electrically couple to gate electrode 44 and source/drain silicide regions (not shown). ILD 52 and ILD 32 may be formed of a same dielectric material or different dielectric materials. A visible interface may be generated between ILD 52 and ILD 32 regardless of whether they are formed of a same material or different materials.

It is observed that in the resulting FinFETs 150, the STI regions 22 that are on opposite sides of a same gate electrode 144 (FIGS. 11B and 11E) have top surfaces 22A that are higher than top surface 22B (FIGS. 11C and 11F), which are underlying (and aligned to) gate electrodes 44. This is different from the conventional FinFETs. In the conventional FinFETs, the STI regions 22 that are on the opposite sides of a gate electrodes have top surfaces that are level with the top surface of the portion of the STI region that is underlying (and aligned to) the respective gate electrode. In addition, in FIGS. 11C and 11F, top surfaces 22A of STI regions 22 that are on the opposite sides of a same epitaxy source/drain region 30 are substantially level with the top surfaces of semiconductor fins 38, as shown in FIGS. 11C and 11F. This is also different from the conventional FinFETs, in which the top surfaces of the STI regions that are on the opposite sides of a same epitaxy source/drain region are lower than the respective semiconductor fin of the respective FinFET.

In addition, referring to FIG. 13, due to the formation of replacement channel 38, which is formed by replacing the original semiconductor strips 24, semiconductor strips 24 may include extending portions 24' extending between semiconductor fin 38 (which also forms the channel region) and source/drain regions 30, wherein portions 24' are formed of a material different from the materials of both semiconductor fin 38 and source/drain region 30.

Further referring to FIG. 13, each of FinFETs 150 and 250 may be a p-type FinFET or an n-type FinFET. The respective materials of semiconductor strips 24 and semiconductor regions 36 are selected to generate desirable strains for the respective FinFETs 150 and 250. For example, for a p-type FinFET, a compressive stress is generated in the respective channel region (the fins 38 or 40 in FIGS. 11C and 11F, respectively). For an n-type FinFET, a tensile strain is generated in the respective channel regions 38 or 40. In some exemplary embodiments, FinFET 150 is a p-type FinFET, and semiconductor strips 24 may comprise silicon, germanium, silicon germanium, III-V compound semiconductor materials, or the like. FinFET 250 is an n-type FinFET, and semiconductor region 36 may comprise silicon, silicon germanium, germanium, III-V compound semiconductor, or the like.

In accordance with embodiments, a device includes a semiconductor substrate, isolation regions in the semiconductor substrate, and a FinFET. The FinFET includes a channel region over the semiconductor substrate, a gate dielectric on a top surface and sidewalls of the channel region, a gate electrode over the gate dielectric, a source/drain region, and an additional semiconductor region between the source/drain region and the channel region. The channel region and the additional semiconductor region are formed of different semiconductor materials, and are at substantially level with each other.

In accordance with other embodiments, a device includes a semiconductor substrate, isolation regions in the semiconductor substrate, and a FinFET. The FinFET includes a semiconductor strip, wherein opposite edges of the semiconductor strip are in contact with opposite sidewalls of the isolation regions, and a semiconductor channel over top surfaces of the isolation regions and overlapping a first portion of the semiconductor strip. The semiconductor channel and the semiconductor strip include different materials.

A source/drain region is disposed adjacent the semiconductor channel. The semiconductor strip further includes a second portion extending between the semiconductor channel and the source/drain region, and wherein the second portion has an edge contacting an edge of the semiconductor channel.

In accordance with yet other embodiments, a method includes forming isolation regions extending from a top surface of a semiconductor substrate into the semiconductor substrate, wherein the isolation regions have a first top surface, and wherein a portion of the semiconductor substrate between two neighboring ones of the isolation regions forms a semiconductor strip. The method further includes forming a dummy gate over the semiconductor strip and the isolation regions, removing the dummy gate, etching a portion of the semiconductor strip under the dummy gate to form a first recess in the semiconductor strip, and performing an epitaxy to grow an epitaxy semiconductor region in the first recess. A portion of the isolation regions under the dummy gate is recessed to form a second recess, wherein a recessed portion of the isolation regions has a second top surface lower than the first top surface. A portion of the epitaxy semiconductor region exposed through the recess forms a semiconductor fin that is over the second top surface of the isolation regions.

In accordance with yet other embodiments, a method includes forming a first fin, a second fin, and a first dielectric layer along sidewalls of the first fin and the second fin, and forming a dummy gate over the first fin, the second fin, and the first dielectric layer. A first semiconductor material is epitaxially grown over the first fin and the second fin on opposing sides of the dummy gate, and a second dielectric layer is formed over the first semiconductor material. A first portion of the dummy gate is removed to expose a first channel region of the first fin and a first portion of the first dielectric layer, and a second semiconductor material is epitaxially grown over the first fin in the first channel region. The first portion of the first dielectric layer is recessed, and a gate electrode is formed over the first fin.

In accordance with yet other embodiments, a method includes forming isolation regions extending from a top surface of a semiconductor substrate into the semiconductor substrate, wherein the isolation regions have a first top surface, and wherein a portion of the semiconductor substrate between two neighboring ones of the isolation regions forms a semiconductor strip, and forming a dummy gate over the semiconductor strip and the isolation regions. A dielectric layer is formed over the semiconductor strip and along sidewalls of the dummy gate, and the dummy gate is removed, thereby exposing an exposed portion of the semiconductor strip and an exposed portion of the isolation regions. Etching is performed on the exposed portion of the semiconductor strip to form a first recess in the semiconductor strip, and an epitaxy process is used to grow an epitaxy semiconductor region in the first recess. The exposed portion of the isolation regions is recessed to form a second recess, wherein a recessed portion of the isolation regions has a second top surface lower than the first top surface, and wherein a portion of the epitaxy semiconductor region exposed through the second recess forms a semiconductor fin extending above the second top surface of the isolation regions.

In accordance with yet other embodiments, a method includes forming trenches in a first dielectric layer over a substrate, forming a first semiconductor layer in the trenches to form a plurality of fins, and forming a dummy gate extending over the fins. The fins are recessed on opposing sides of the dummy gate, and a second semiconductor layer is formed over the fins on opposing sides of the dummy gate. A second dielectric layer is formed over the second semiconductor layer on opposing sides of the dummy gate, and a first portion of the dummy gate is removed over one or more first fins of the plurality of fins to expose one or more first channel regions and a first portion of the first dielectric layer, and the first channel regions are recessed. A third semiconductor layer is formed in the first channel regions, and a gate electrode is formed over the one or more first fins.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a semiconductor substrate, the semiconductor substrate comprising a first fin and a second fin of a first semiconductor material;
    a first epitaxial region and a second epitaxial region in the first fin, the first epitaxial region and the second epitaxial region comprising a second semiconductor material different than the first semiconductor material;
    a third epitaxial region interposed between the first epitaxial region and the second epitaxial region in the first fin, the third epitaxial region comprising a third semiconductor material different than the first semiconductor material and the second semiconductor material, wherein the first semiconductor material separates the third semiconductor material from the first epitaxial region and the second epitaxial region, wherein the first semiconductor material has a concave surface along an interface between first semiconductor material and a sidewall of the first epitaxial region;
    a fourth epitaxial region and a fifth epitaxial region in the second fin;
    shallow-trench isolation regions along opposing sides of the first fin and the second fin, wherein an upper surface of the shallow-trench isolation regions is higher than a lower surface of the third epitaxial region, wherein the shallow-trench isolation regions directly contacts the third epitaxial region;
    a first gate electrode over the third epitaxial region in the first fin; and
    a second gate electrode over the first semiconductor material of the second fin between the fourth epitaxial region and the fifth epitaxial region, wherein the first semiconductor material of the second fin extends continuously between the fourth epitaxial region and the fifth epitaxial region along a shortest line between the fourth epitaxial region and the fifth epitaxial region.

2. The device of claim 1, further comprising a first gate dielectric interposed between the first gate electrode and the third epitaxial region, wherein the third semiconductor material in the third epitaxial region is completely contained within lateral boundaries of the first gate dielectric.

3. The device of claim 2, wherein the first gate dielectric completely covers the third epitaxial region in a direction orthogonal to a direction of current flow between the first epitaxial region and the second epitaxial region.

4. The device of claim 1, wherein the first epitaxial region and the second epitaxial region extend higher than the third epitaxial region.

5. The device of claim 1, further comprising a first spacer and a second spacer on opposing sides of the first gate electrode, wherein the first epitaxial region extends under the first spacer and the second epitaxial region extends under the second spacer.

6. The device of claim 1, wherein the semiconductor substrate comprises a base substrate, wherein the first fin and the second fin protrude from the base substrate, wherein the base substrate comprises a different semiconductor material than the first fin and the second fin.

7. The device of claim 1 further comprising a gate spacer along a sidewall of the first gate electrode, the first epitaxial region extending under the gate spacer.

8. A device comprising:
a first transistor comprising:
a first semiconductor material extending from a substrate to form a first fin, the first semiconductor material and the substrate being different semiconductor materials;
a second semiconductor material extending into the first semiconductor material of the first fin, the second semiconductor material having a different lattice constant than the first semiconductor material;
a first source/drain region in the second semiconductor material;
a third semiconductor material extending into the first semiconductor material of the first fin, the third semiconductor material having a different lattice constant than the first semiconductor material, wherein a bottom surface of the third semiconductor material is level with a bottom surface of the second semiconductor material, wherein a sidewall of the second semiconductor material facing the third semiconductor material is concave;
a first gate dielectric over the third semiconductor material in the first fin, wherein the third semiconductor material extends lower than the first gate dielectric; and
a first gate electrode over the first gate dielectric, wherein a first channel region of the first transistor comprises the third semiconductor material; and
a second transistor comprising:
the first semiconductor material extending from the substrate to form a second fin;
a fourth semiconductor material extending into the first semiconductor material of the second fin, the fourth semiconductor material having a different lattice constant than the first semiconductor material;
a second source/drain region in the fourth semiconductor material;
a second gate dielectric over the first semiconductor material of the second fin; and
a second gate electrode over the second gate dielectric, wherein a second channel region of the second transistor is only the first semiconductor material.

9. The device of claim 8, wherein the second semiconductor material does not share an interface with the third semiconductor material.

10. The device of claim 8, further comprising isolation regions along opposing sides of the first semiconductor material.

11. The device of claim 10, wherein the third semiconductor material extends lower than an uppermost surface of the isolation regions.

12. The device of claim 10, wherein an upper surface of the isolation regions adjacent the first gate electrode is higher than an upper surface of the isolation regions directly below the first gate electrode.

13. The device of claim 8, wherein the first semiconductor material extends to an uppermost surface of the third semiconductor material.

14. The device of claim 8, further comprising an inter-layer dielectric on opposing sides of the first gate electrode, wherein an upper surface of the inter-layer dielectric is level with an upper surface of the first gate electrode.

15. A device comprising:
a first fin and a second fin of a first semiconductor material;
first source/drain regions on the first fin, the first source/drain regions comprising a first source/drain semiconductor material different than the first semiconductor material in the first fin, the first source/drain semiconductor material having a different lattice constant than the first semiconductor material;
a first channel region comprising a third semiconductor material interposed between the first source/drain regions and adjacent the first semiconductor material in the first fin, the third semiconductor material having a different lattice constant than the first semiconductor material, wherein the first semiconductor material extends between the first source/drain semiconductor material and the third semiconductor material in the first fin;
a first gate electrode over the third semiconductor material;
a first gate spacer along a sidewall of the first gate electrode, wherein the first source/drain semiconductor material extends under the first gate spacer;
a first gate dielectric interposed between the first gate electrode and the third semiconductor material, wherein the first gate dielectric extends along a top surface and a first sidewall of the third semiconductor material, wherein the first gate dielectric extends along an upper portion of the first sidewall, wherein a lower portion of the first sidewall is free of the first gate dielectric;
second source/drain regions on the second fin, the second source/drain regions comprising a second source/drain semiconductor material different than the first semiconductor material in the second fin, the second source/drain semiconductor material having a different lattice constant than the first semiconductor material in the second fin;
a second channel region interposed between the second source/drain regions;
a second gate electrode over the first semiconductor material interposed between the second source/drain regions, wherein the second channel region below the second gate electrode is free of semiconductor materials other than the first semiconductor material;

a second gate spacer along a sidewall of the second gate electrode, wherein the second source/drain semiconductor material extends under the second gate spacer; and a second gate dielectric interposed between the second gate electrode and the first semiconductor material of the second fin, wherein the second gate dielectric extends along a top surface and a first sidewall of the first semiconductor material.

16. The device of claim 15, wherein the third semiconductor material extends to an uppermost surface of the first semiconductor material.

17. The device of claim 15, wherein the third semiconductor material does not contact the second source/drain semiconductor material.

18. The device of claim 15, where the first gate dielectric extends over a first isolation region, the first gate dielectric extending lower than an uppermost surface of the first isolation region.

19. The device of claim 15, wherein the first fin and the second fin extend from a substrate, wherein the substrate comprises a different semiconductor material than the first semiconductor material.

20. The device of claim 15 further comprising an isolation feature interposed between and contacting the first source/drain semiconductor material and the second source/drain semiconductor material.

* * * * *